(12) United States Patent
Chen

(10) Patent No.: US 10,700,189 B1
(45) Date of Patent: Jun. 30, 2020

(54) SEMICONDUCTOR DEVICES AND METHODS FOR FORMING THE SAME

(71) Applicant: Vanguard International Semiconductor Corporation, Hsinchu (TW)

(72) Inventor: Chih-Yen Chen, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/213,060

(22) Filed: Dec. 7, 2018

(51) Int. Cl.
*H01L 29/778* (2006.01)
*H01L 21/02* (2006.01)
*H01L 29/66* (2006.01)

(52) U.S. Cl.
CPC ........ *H01L 29/778* (2013.01); *H01L 21/0254* (2013.01); *H01L 29/66462* (2013.01)

(58) Field of Classification Search
CPC .......... H01L 21/0254; H01L 29/66462; H01L 29/778
See application file for complete search history.

(56) References Cited

U.S. PATENT DOCUMENTS

| | | | | |
|---|---|---|---|---|
| 8,772,786 B2* | 7/2014 | Tabatabaie | ........ | H01L 29/66462 257/76 |
| 2002/0119610 A1* | 8/2002 | Nishii | ............... | H01L 29/66462 438/167 |
| 2012/0313145 A1* | 12/2012 | Makabe | ............ | H01L 21/02378 257/194 |
| 2014/0203288 A1* | 7/2014 | Hsiung | ............... | H01L 29/7787 257/76 |
| 2016/0043219 A1* | 2/2016 | Liu | ...................... | H01L 29/7827 257/329 |
| 2016/0141404 A1* | 5/2016 | Tsai | .................... | H01L 29/7787 257/76 |
| 2017/0141218 A1 | 5/2017 | Iucolano et al. | | |
| 2018/0083133 A1* | 3/2018 | Bayram | ............. | H01L 29/7787 |
| 2018/0097096 A1 | 4/2018 | Sugiyama et al. | | |
| 2018/0166565 A1* | 6/2018 | Chen | ................... | H01L 29/1066 |

OTHER PUBLICATIONS

Taiwanese Office Action and Search Report for Taiwanese Application No. 107128800, dated Oct. 29, 2019.

* cited by examiner

*Primary Examiner* — Allan R Wilson
(74) *Attorney, Agent, or Firm* — Birch, Stewart, Kolasch & Birch, LLP

(57) ABSTRACT

A semiconductor device is provided. The semiconductor device includes a substrate, a channel layer, a barrier layer, a compound semiconductor layer, a dopant holding layer, a source/drain pair, and a gate. The channel layer is disposed over the substrate. The barrier layer is disposed over the channel layer. The compound semiconductor layer and the dopant holding layer are disposed over the barrier layer. The source/drain pair are disposed over the substrate and on both sides of the compound semiconductor layer. The gate is disposed over the compound semiconductor layer.

19 Claims, 3 Drawing Sheets

SEMICONDUCTOR DEVICES AND METHODS FOR FORMING THE SAME

BACKGROUND

Technical Field

The embodiment of the present disclosure relates to semiconductor manufacturing, and in particular it relates to semiconductor devices and methods for forming same.

Description of the Related Art

A high electron mobility transistor (HEMT), also known as a heterostructure field-effect transistor (HFET) or a modulation-doped field-effect transistor (MODFET), is a kind of a field effect transistor (FET) formed of semiconductor materials having different energy gaps. A two-dimensional electron gas (2DEG) layer is formed at the interface between two different semiconductor materials that are adjacent to each other. Due to the high electron mobility of the two-dimensional electron gas, the HEMT can have high breakdown voltage, high electron mobility, low on-resistance and low input capacitance, and is therefore suitable for high-power components.

In order to improve performance, the HEMT is usually doped. However, the doping process may be accompanied by defects and may even damage the HEMT. Therefore, it is necessary to continuously develop an improved HEMT to improve the performance, improve the yield and have a wider range of applications.

BRIEF SUMMARY

In accordance with some embodiments of the present disclosure, a semiconductor device is provided. The semiconductor device includes a channel layer disposed over a substrate; a barrier layer disposed over the channel layer; a compound semiconductor layer and a dopant holding layer disposed over the barrier layer; a source/drain pair disposed over the substrate and on both sides of the compound semiconductor layer; and a gate disposed on the compound semiconductor layer.

In some embodiments, a dopant content of the dopant holding layer is higher than a dopant content outside of the dopant holding layer.

In some embodiments, the dopant holding layer includes aluminum nitride, aluminum gallium nitride, indium gallium nitride, or a combination thereof.

In some embodiments, a thickness of the dopant holding layer is between 0.5 nm and 5 nm.

In some embodiments, the dopant holding layer includes a first dopant holding layer disposed on a top, an interior, or a bottom of the compound semiconductor layer; and/or a second dopant holding layer covering a sidewall of the compound semiconductor layer and extending between the source/drain pair and the barrier layer.

In some embodiments, the semiconductor device further includes the source/drain pair passing through the barrier layer and extending into the channel layer, and the second dopant holding layer extending between the source/drain pair and the channel layer.

In some embodiments, the second dopant holding layer has an opening disposed on the compound semiconductor layer, and the gate is disposed at the opening.

In some embodiments, the semiconductor device further includes a two-dimensional electron gas (2DEG) recovery layer covering a sidewall of the compound semiconductor layer and extending between the source/drain pair and the barrier layer.

In some embodiments, the semiconductor device further includes the source/drain pair passing through the barrier layer and extending into the channel layer, and the two-dimensional electron gas recovery layer extending between the source/drain pair and the channel layer.

In some embodiments, the two-dimensional electron gas recovery layer includes a hexagonal crystal binary compound semiconductor, graphene, or a combination thereof.

In accordance with another embodiment of the present disclosure, a method for forming semiconductor devices is provided. The method includes forming a channel layer over a substrate; forming a barrier layer over the channel layer; forming a compound semiconductor layer and a dopant holding layer over the barrier layer; forming a source/drain pair over the substrate and on both sides of the compound semiconductor layer; and forming a gate over the compound semiconductor layer.

In some embodiments, forming the dopant holding layer includes using metal organic chemical vapor deposition (MOCVD), atomic layer deposition (ALD), molecular beam epitaxy (MBE), liquid phase epitaxy (LPE), or a combination thereof.

In some embodiments, the dopant holding layer includes aluminum nitride, aluminum gallium nitride, indium gallium nitride, or a combination thereof.

In some embodiments, a thickness of the dopant holding layer is between 0.5 nm and 5 nm.

In some embodiments, forming the dopant holding layer includes forming a first dopant holding layer at a top, an interior, or a bottom of the compound semiconductor layer during the formation of the compound semiconductor layer; and/or forming a second dopant holding layer on a sidewall of the compound semiconductor layer, wherein the second dopant holding layer extends between the source/drain pair and the channel layer.

In some embodiments, the source/drain pair extends further into the channel layer, and the second dopant holding layer extends between the source/drain pair and the channel layer.

In some embodiments, the second dopant holding layer has an opening formed over the compound semiconductor layer, and the gate is disposed at the opening.

In some embodiments, the method further includes forming a two-dimensional electron gas (2DEG) recovery layer on a sidewall of the compound semiconductor layer, wherein the two-dimensional electron gas recovery layer extends between the source/drain pair and the channel layer.

In some embodiments, the source/drain pair further pass through the barrier layer and extend into the channel layer, and the two-dimensional electron gas recovery layer extends between the source/drain pair and the channel layer.

In some embodiments, the two-dimensional electron gas recovery layer includes a hexagonal crystal binary compound semiconductor, graphene, or a combination thereof.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the order of processes and/or including more or fewer steps than described herein.

Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations.

A semiconductor device and a method for forming the same are described in accordance with some embodiments of the present disclosure, and are particularly applicable to a high electron mobility transistor (HEMT). The present disclosure provides a semiconductor device including a dopant holding layer to prevent dopants in a compound semiconductor layer diffuse into surrounding components, and avoid subsequent processes, such as an etching process, affecting regions under the dopant holding layer, thereby improving the yield of semiconductor devices.

Figure 1A:
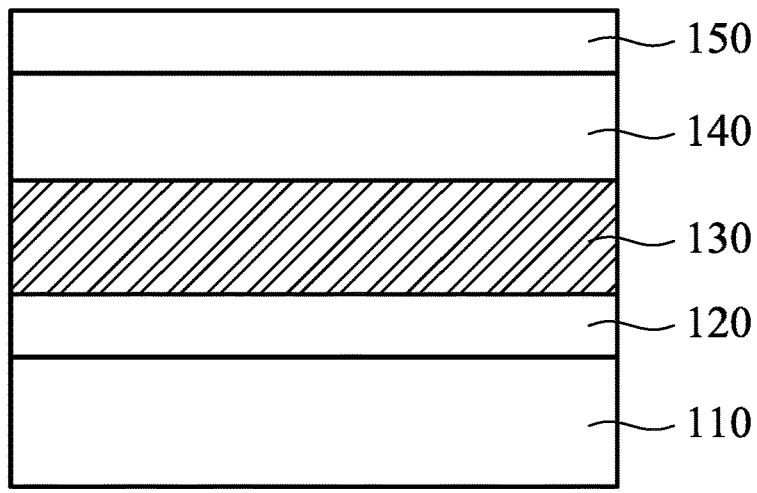
FIGS. 1A-1C are cross-sectional views illustrating a semiconductor device at various stages of manufacture in accordance with some embodiments of the present disclosure.
Figure 1B:
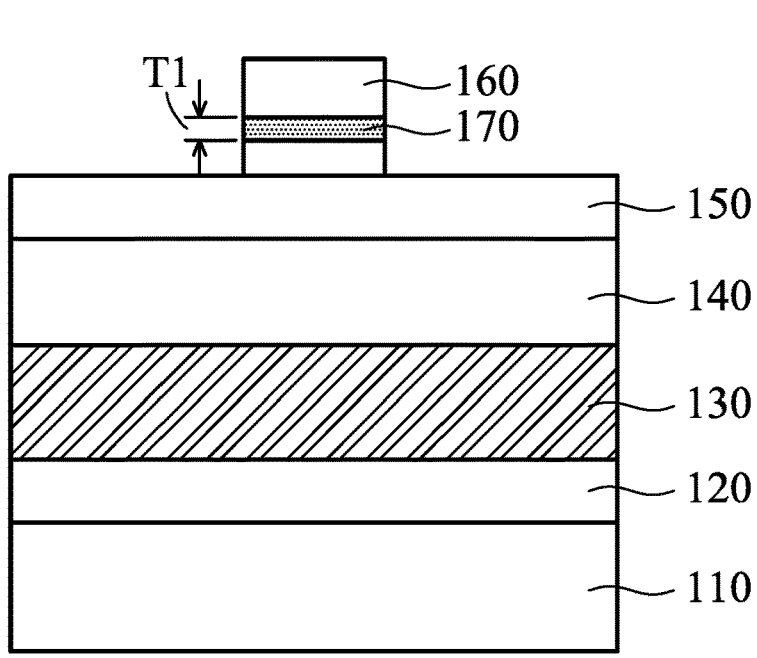
Figure 1C:
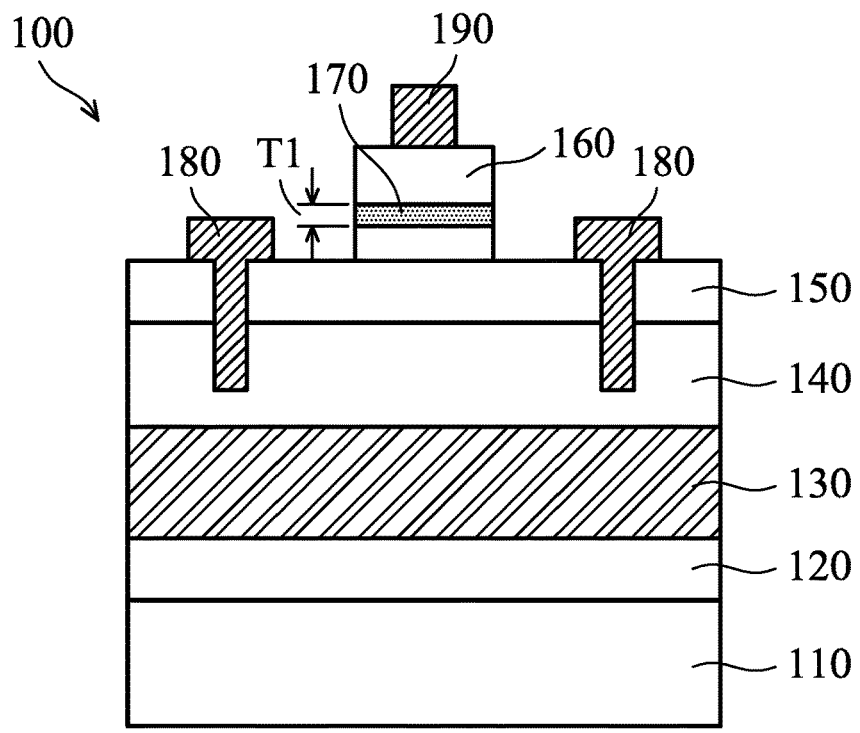

FIGS. 1A-1C are cross-sectional views illustrating a semiconductor device at various stages of manufacture in accordance with some embodiments of the present disclosure. As shown in FIG. 1A, a semiconductor device 100 includes a substrate 110. Any substrate material suitable for a semiconductor device may be used. The substrate 110 may be a bulk semiconductor substrate or a composite substrate formed of different materials, and the substrate 110 may be doped (e.g., using p-type or n-type dopants) or undoped. In some embodiments, the substrate 110 may include a semiconductor substrate, a glass substrate, or a ceramic substrate, for example, a silicon substrate, a silicon germanium substrate, a silicon carbide (SiC) substrate, an aluminum nitride (AlN) substrate, a sapphire substrate, a combination thereof, or the like. In some embodiments, the substrate 110 may include a semiconductor-on-insulator (SOI) substrate formed by providing a semiconductor material over an insulating layer.

In some embodiments, a nucleation layer 120 is formed over the substrate 110 to relieve the lattice mismatch between the substrate 110 and layers grown thereon and improve the crystalline quality. The nucleation layer 120 may be formed by a deposition process, such as metal organic chemical vapor deposition (MOCVD), atomic layer deposition (ALD), molecular beam epitaxy (MBE), liquid phase epitaxy (LPE), the like, or a combination thereof. In some embodiments, the thickness of the nucleation layer 120 may range from about 1 nanometer (nm) to about 500 nm, such as about 200 nm.

In some embodiments, a buffer layer 130 is formed over the nucleation layer 120 to relieve the lattice mismatch between different layers and improve the crystalline quality. The nucleation layer 120 is optional. In other embodiments, the buffer layer 130 may be formed directly on the substrate without providing the nucleation layer 120, to reduce the number of steps in the process and to improve performance. In some embodiments, the buffer layer 130 may include a group III-V compound semiconductor material, such as a group III nitride. For example, the buffer layer 130 may include gallium nitride (GaN), aluminum nitride (AlN), aluminum gallium nitride (AlGaN), aluminum indium nitride (AlInN), the like, or a combination thereof. In some embodiments, the buffer layer 130 may be formed by a deposition process, such as metal organic chemical vapor deposition (MOCVD), atomic layer deposition (ALD), molecular beam epitaxy (MBE), liquid phase epitaxy (LPE), the like, or a combination thereof.

Then, a channel layer 140 is formed over the buffer layer 130. In some embodiments, the channel layer 140 may include one or more group III-V compound semiconductor materials, such as a group III nitride. In some embodiments, the channel layer 140 is, for example, GaN, AlGaN, InGaN, InAlGaN, the like, or a combination thereof. In addition, the channel layer 140 may be doped or undoped. According to some embodiments, the channel layer 140 may be formed by a deposition process, such as metal organic chemical vapor deposition (MOCVD), atomic layer deposition (ALD), molecular beam epitaxy (MBE), liquid phase epitaxy (LPE), the like, or a combination thereof. In some embodiments, the thickness of the channel layer 140 may range from about 0.05 micrometers (μm) to about 1 μm, such as about 0.2 μm.

Then, a barrier layer 150 is formed over the channel layer 140 to create a two-dimensional electron gas (2DEG) at an interface between the channel layer 140 and the barrier layer 150. The barrier layer 150 may be formed by a deposition process, such as metal organic chemical vapor deposition (MOCVD), atomic layer deposition (ALD), molecular beam epitaxy (MBE), liquid phase epitaxy (LPE), the like, or a combination thereof. In some embodiments, the barrier layer 150 may include a group III-V compound semiconductor material, such as a group III nitride. For example, the barrier layer 150 may include AlN, AlGaN, AlInN, AlGaInN, the like, or a combination thereof. The barrier layer 150 may include a single layer or a multilayer structure, and the barrier layer 150 may be doped or undoped. In some embodiments, the thickness of the barrier layer 150 may range from about 1 nm to about 30 nm, such as about 20 nm.

Next, as shown in FIG. 1B, a compound semiconductor layer 160 is disposed over the barrier layer 150 to vacate the two-dimensional electron gas under a gate to achieve a normally-off state of the semiconductor device in accordance with some embodiments. In some embodiments, the compound semiconductor layer 160 includes u-type, n-type or p-type doped GaN. In some embodiments, the thickness of the compound semiconductor layer 160 may range from about 30 nm to about 150 nm, such as about 80 nm.

In some embodiments, the compound semiconductor layer 160 may be formed by a deposition process and a patterning process. For example, the deposition process includes metal organic chemical vapor deposition (MOCVD), atomic layer deposition (ALD), molecular beam epitaxy (MBE), liquid phase epitaxy (LPE), the like, or a combination thereof. In some embodiments, the patterning process includes forming a patterned mask layer (not illustrated) on the deposited material layer, then etching a portion of the deposited material layer that is not covered by the patterned mask layer, and forming the compound semiconductor layer 160. The position of the compound semiconductor layer 160 is adjusted according to the position of the gate to be set.

In some embodiments, the patterned mask layer may be a photoresist, such as a positive photoresist or a negative photoresist. In other embodiments, the patterned mask layer may be a hard mask, such as silicon oxide, silicon nitride, silicon oxynitride, silicon carbide, silicon carbon nitride, the like, or a combination thereof. In some embodiments, the patterned mask layer may be formed by spin-on coating, physical vapor deposition (PVD), chemical vapor deposition (CVD), the like, or a combination thereof.

In some embodiments, the deposited material layer may be etched by using a dry etch process, a wet etch process, or a combination thereof. For example, the deposited material layer may be etched by reactive ion etching (RIE), inductively-coupled plasma (ICP) etching, neutral beam etching (NBE), electron cyclotron resonance (ERC) etching, the like, or a combination thereof.

Furthermore, the compound semiconductor layer 160 as illustrated in the figures has substantially vertical sidewalls and a flat upper surface, but the present disclosure is not limited thereto, and the compound semiconductor layer 160 may have another shape, such as an inclined sidewall and/or an uneven surface.

In some embodiments, forming the compound semiconductor layer 160 further includes being doped with a dopant. For example, for the compound semiconductor layer 160 is a p-type doped GaN, the dopant may include magnesium (Mg). However, during the manufacture of the semiconductor device 100, heat treatment is usually performed several times, so that the dopant thermal diffuses out of the compound semiconductor layer 160 and into other components and therefore affects the performance of the semiconductor device 100, for example, lowering the threshold voltage (Vth).

As shown in FIG. 1B, a first dopant holding layer 170 is disposed in the compound semiconductor layer 160 to form a stable alloy with the dopant to avoiding the dopant diffusing outward to other components in accordance with some embodiments. In some embodiments, the first dopant holding layer 170 may be formed by a deposition process, such as metal organic chemical vapor deposition (MOCVD), atomic layer deposition (ALD), molecular beam epitaxy (MBE), liquid phase epitaxy (LPE), the like, or a combination thereof. The first dopant holding layer 170 may be formed during the formation of the compound semiconductor layer 160. In some embodiments, the first dopant holding layer 170 has a thickness T1 ranging from about 0.5 nm to about 5 nm, such as about 4 nm.

In some embodiments, the first dopant holding layer 170 may include aluminum nitride (AlN), aluminum gallium nitride (AlGaN), indium gallium nitride (InGaN), the like, or a combination thereof. Since the material selected for the first dopant holding layer 170 may form an alloy, such as a magnesium aluminum alloy, with the dopant, the dopant may be fixed at the location of the first dopant holding layer 170. Therefore, the dopant content of the first dopant holding layer 170 is higher than the dopant content outside of the first dopant holding layer 170.

In the illustrated embodiment, the first dopant holding layer 170 is in the compound semiconductor layer 160, but the present disclosure is not limited thereto, and the position of the first dopant holding layer 170 may be adjusted. For example, the first dopant holding layer 170 may be disposed on the top or bottom of the compound semiconductor layer 160. In some embodiments, the first dopant holding layer 170 is disposed in the compound semiconductor layer 160, as compared to the first dopant holding layer 170 disposed on the top or the bottom of the compound semiconductor layer 160, to maintain the dopant farther away from other components and to reduce the likelihood that the dopant will affect other components since the first dopant holding layer 170 is separated from other components (e.g., barrier layer 150).

Next, as shown in FIG. 1C, a source/drain pair 180 and a gate 190 are provided to form the semiconductor device 100 in accordance with some embodiments. The source/drain pair 180 are respectively located on opposite sides of the compound semiconductor layer 160 over the substrate 110. In some embodiments, the source/drain pair 180 and the gate 190 may be formed by performing a patterning process to etch the barrier layer 150 and the channel layer 140 on the opposite sides of the compound semiconductor layer 160 to form a pair of recesses which pass through the barrier layer 150 and extend into the channel layer 140. Then a conductive material is deposited over the pair of recesses and the compound semiconductor layer 160, and the patterned process is performed on the deposited conductive material to form the source/drain pair 180 and the gate 190 at a predetermined location.

In some embodiments, the deposition process of the conductive material may include physical vapor deposition (PVD), chemical vapor deposition (CVD), atomic layer deposition (ALD), molecular beam epitaxy (MBE), liquid phase epitaxy (LPE), the like, or a combination thereof. In some embodiments, the conductive material may include a metal, a metal silicide, a semiconductor material, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu), titanium nitride (TiN), the like, an alloy thereof, a multilayer thereof, or a combination thereof, and the semiconductor material may include polycrystalline silicon (poly-Si) or polycrystalline germanium (poly-Ge).

In the embodiment as illustrated in FIG. 1C, the source/drain pair 180 are on the barrier layer 150 and extend into the barrier layer 150 and the channel layer 140, but the present disclosure is not limited thereto, and the depth to which the source/drain pair 180 extends may be adjusted based on the desired characteristics of the final product. For example, the source/drain pair 180 may extend only into a portion of the barrier layer 150 or may not extend into the barrier layer 150 to prevent the source/drain pair 180 from passing through the two-dimensional electron gas, and thereby maintaining the two-dimensional electron gas at the interface between the channel layer 140 and the barrier layer 150.

The source/drain 180 and the gate 190 are formed in the same step as described herein, but the present disclosure is not limited thereto. For example, the gate 190 may be formed after the formation of the source/drain 180. In addition, the source/drain 180 and the gate 190 may be formed independently by the same or different processes and materials. Furthermore, the shape of the source/drain 180 and the gate 190 are not limited to the vertical sidewalls as illustrated in the figures, and may have inclined sidewalls or another shape.

According to some embodiments of the present disclosure, the first dopant holding layer 170 disposed in the semiconductor device 100 may form a stable alloy with the dopant in the compound semiconductor layer 160 to improve the thermal stability of the dopant in order to avoid the dopant diffusing outward to the surrounding components and may also protect the underlying region during subsequent processes, thereby improve the yield of the semiconductor device 100. In addition, the first dopant holding layer 170 disposed in the compound semiconductor layer 160 may have a spacing between the alloy formed by the dopant and the first dopant holding layer 170 and other components, thereby reducing possible harmful effects caused by the dopant.

Figure 2:
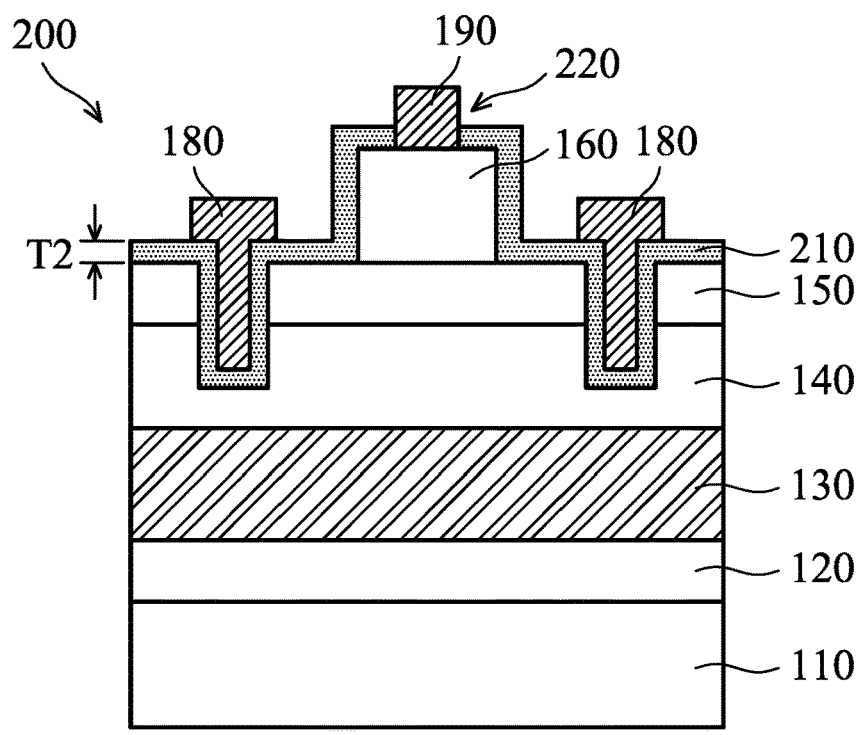
FIGS. 2-4 are cross-sectional views illustrating semiconductor devices in accordance with another embodiment of the present disclosure.

FIG. 2 is a cross-sectional view illustrating a semiconductor device 200 in accordance with other embodiments. In some embodiments, a second dopant holding layer 210 may be disposed to cover the sidewall of the compound semiconductor layer 160 and extend between the source/drain pair 180 and the barrier layer 150 to avoid the dopant diffusing outward and protect the underlying components.

In some embodiments, the second dopant holding layer 210 may be formed by the processes and materials of the first dopant holding layer 170 as previously described. Since the material selected for the second dopant holding layer 210 may form a thermally stable alloy with the dopant, the dopant may be fixed at the location of the second dopant holding layer 210. Therefore, the dopant content of the second dopant holding layer 210 is higher than the dopant content outside of the second dopant holding layer 210. In some embodiments, the second dopant holding layer 210 has a thickness T2 ranging from about 0.5 nm to about 5 nm, such as about 4 nm.

After the second dopant holding layer 210 is formed, an opening 220 is formed on the second dopant holding layer 210, and the opening 220 is over the compound semiconductor layer 160. The position of the opening 220 is adjusted according to the position of the gate 190 to be set. In some embodiments, the opening 220 may be formed by etching a portion of the second dopant holding layer 210 which is exposed by the patterned mask layer with a patterned mask layer (not illustrated) to remove the portion of the second dopant holding layer 210. The materials and methods for forming the patterned mask layer are as described above, and will not be repeated again.

In some embodiments, the second dopant holding layer 210 may be etched by using a dry etch process, a wet etch process, or a combination thereof. For example, the second dopant holding layer 210 may be etched by reactive ion etching (RIE), inductively coupled plasma (ICP) etching, neutron beam etching (NBE), electron cyclotron resonance (ERC) etching, the like, or a combination thereof.

Then, a conductive material is deposited in the opening 220 and in a pair of recesses to provide a source/drain pair 180 over the barrier layer 150 and respectively on opposite sides of the compound semiconductor layer 160, and a gate 190 is disposed at the opening 220 to form the semiconductor device 200. The source/drain 180 and the gate 190 are simultaneously formed as described herein, but the present disclosure is not limited thereto. For example, the opening 220 may be formed after the source/drain 180 is formed, and then the gate 190 is formed by using the same patterned mask layer as the opening 220. In addition, the source/drain 180 and the gate 190 may be formed independently by the same or different processes and materials. Moreover, the shape of the source/drain 180 and the gate 190 are not limited to the vertical sidewalls as illustrated in the figures, and may have inclined sidewalls or have another shape. In the embodiment illustrated in FIG. 2, the opening 220 and the bottom surface of the gate 190 have substantially the same area, but the present disclosure is not limited thereto.

As described above, the depth at which the source/drain 180 extends into the layers may be adjusted, and thus the position of the second dopant holding layer 210 may also be adjusted. For example, in some embodiments, in the case where the source/drain pair 180 extends only into a portion of the barrier layer 150 or do not extend into the barrier layer 150, the second dopant holding layer 210 extends between the source/drain pair 180 and the barrier layer 150. On the other hand, in the case where the source/drain pair 180 further extend into the channel layer 140, the second dopant holding layer 210 is further disposed between the source/drain pair 180 and the channel layer 140.

According to some embodiments of the present disclosure, the second dopant holding layer 210, disposed in the semiconductor device 200, covering the sidewall of the compound semiconductor layer 160 and extending between the source/drain 180 and the barrier layer 150 may form a stable alloy with the dopant in the compound semiconductor layer 160, thereby improves the thermal stability of the dopant to avoid the dopant diffusing outward. In addition, the second dopant holding layer 210 can protect the underlying region during subsequent processes and suppress the leakage, thereby improving the yield and reliability of the semiconductor device 200.

Figure 3:
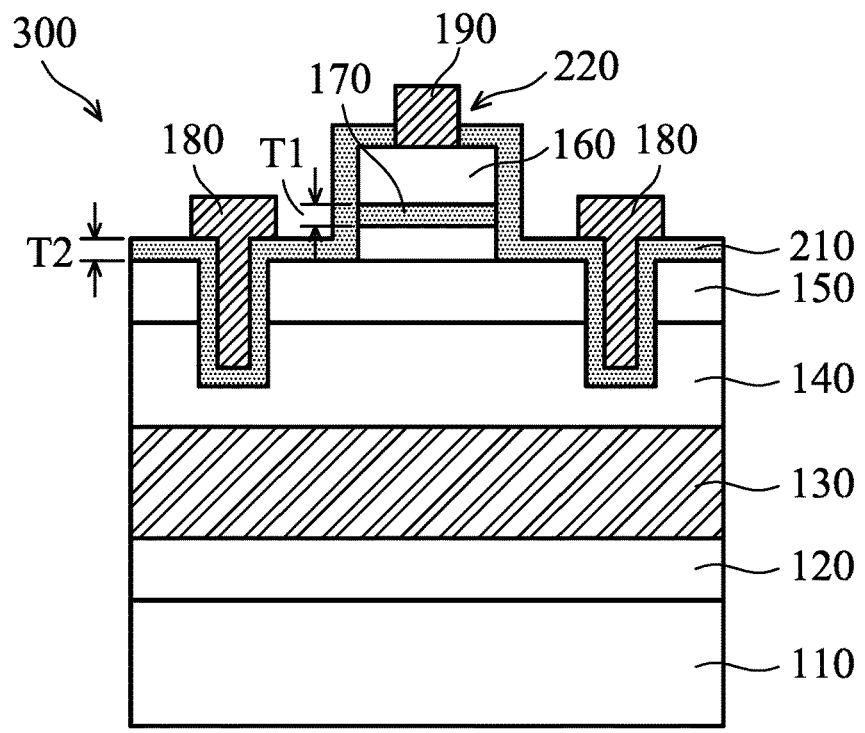

FIG. 3 is a cross-sectional view illustrating a semiconductor device 300 in accordance with some embodiments. In some embodiments, as shown in FIG. 3, both the first dopant holding layer 170 and the second dopant holding layer 210 may be disposed to further improve the thermal stability of the dopant, and may further protect the region under the first dopant holding layer 170 and the second dopant holding layer 210, and the leakage may be reduced. The positions, materials and processes of the first dopant holding layer 170 and the second dopant holding layer 210 are as described above, and will not be repeated again.

Figure 4:
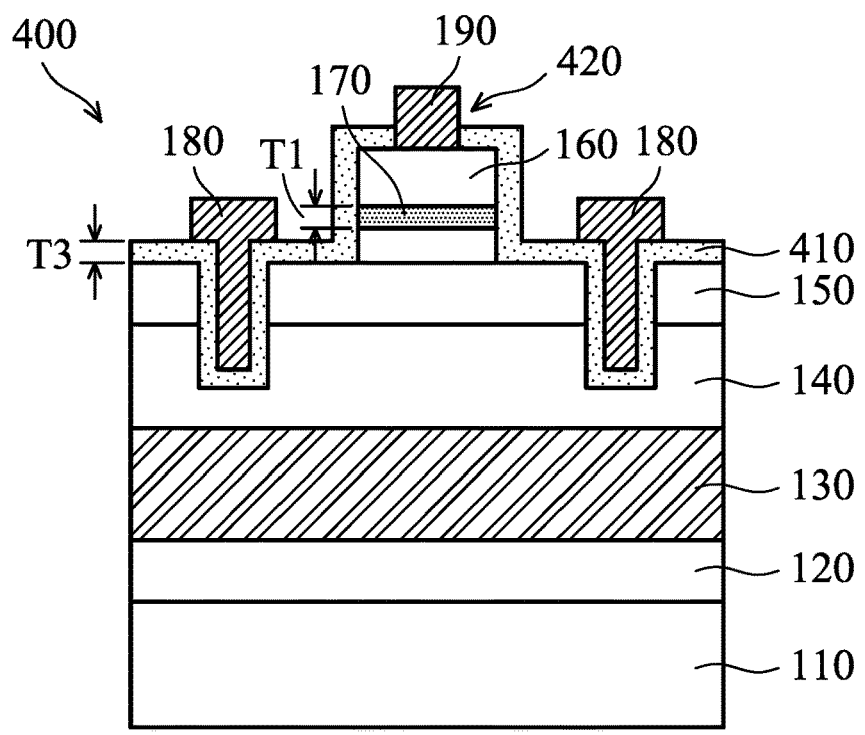

FIG. 4 is a cross-sectional view illustrating a semiconductor device 400 in accordance with some embodiments. In some embodiments, as shown in FIG. 4, the semiconductor device 400 further includes a two-dimensional electron gas (2DEG) recovery layer 410 covering the sidewall of the compound semiconductor layer 160 and extending between the source/drain 180 and the barrier layer 150 to recover the channel of the two-dimensional electron gas around the source/drain 180.

In some embodiments, the two-dimensional electron gas recovery layer 410 may be formed by a deposition process, such as metal organic chemical vapor deposition (MOCVD), atomic layer deposition (ALD), molecular beam epitaxy (MBE), liquid phase epitaxy (LPE), the like, or a combination thereof. The two-dimensional electron gas recovery layer 410 may include a hexagonal crystal binary compound semiconductor, graphene, the like, or a combination thereof. In some embodiments, the two-dimensional electron gas recovery layer 410 may include aluminum nitride (AlN), zinc oxide (ZnO), indium nitride (InN), the like, or a combination thereof.

As described above, the depth to which the source/drain 180 extends into the layer may be adjusted, and thus the position of the two-dimensional electron gas recovery layer 410 may also be adjusted. Furthermore, the two-dimensional electron gas recovery layer 410 may have an opening 420 at which the gate 190 is disposed. The opening 420 of the two-dimensional electron gas recovery layer 410 may be formed by the method of forming the opening 220 of the second dopant holding layer 210 as described above, and will not be repeated again.

Furthermore, the semiconductor device 400 is illustrated in FIG. 4 as having both the first dopant holding layer 170 and the two-dimensional electron gas recovery layer 410, but the present disclosure is not limited thereto. For example, the two-dimensional electron gas recovery layer 410 may be disposed individually.

In some embodiments, the thickness T3 of the two-dimensional electron gas recovery layer 410 is between about 0.5 nm and about 5 nm, for example about 4 nm. For convenience of illustration, the thickness T1 of the first dopant holding layer 170 and the thickness T3 of the two-dimensional electron gas recovery layer 410 are substantially the same, but the present disclosure is not limited thereto, and the thickness T1 may be larger than, equal to, or smaller than the thickness T3. In addition, the positions of the first dopant holding layer 170 and the two-dimensional electron gas recovery layer 410 are not limited to the illustrated figures, for example, the first dopant holding layer 170 may be disposed at the bottom of the compound semiconductor layer 160.

According to some embodiments of the present disclosure, providing the semiconductor device 400 including the two-dimensional electron gas recovery layer 410 may lower the junction resistance ($R_C$) and improve the on-resistance ($R_{ON}$), further to protect the underlying layers from affected by subsequent processes, thereby improve the performance and the yield of the semiconductor device 400.

According to some embodiments, the present disclosure provides one or more dopant holding layers on the top, the interior, the bottom, and/or the sidewalls of the compound semiconductor layer, the composition of which may form a stable alloy with the dopant to avoid the dopant in the compound semiconductor layer diffusing outward. In addition, the one or more of the dopant holding layers may also provide protection to the underlying region from subsequent processes, such as etching processes, to reduce defects and increase the yield. In addition, the position of the one or more layers of the dopant holding layer may be adjusted to further reduce the influence of the dopant on other components, and the one or more dopant holding layers disposed in specific positions may also suppress the leakage and improve the reliability of the semiconductor device, in accordance with some embodiments.

Furthermore, in accordance with another embodiment, the present disclosure provides a semiconductor device including a two-dimensional electron gas (2DEG) recovery layer which covers a sidewall of the compound semiconductor layer and extends between the source/drain pair and the barrier layer to recover the channel of the surrounding two-dimensional electron gas to reduce the junction resistance ($R_C$), thereby improving the on-resistance ($R_{ON}$) of the semiconductor device, while protecting the region under the two-dimensional electron gas recovery layer.

While the present disclosure has been described above by various embodiments, these embodiments are not intended to limit the disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced without does not depart from the spirit and scope of the disclosure. Therefore, the scope of protection of the present disclosure is defined as the subject matter set forth in the appended claims.

What is claimed is:

1. A semiconductor device, comprising:
   a channel layer disposed over a substrate;
   a barrier layer disposed over the channel layer;
   a compound semiconductor layer and a dopant holding layer disposed over the barrier layer, wherein the dopant holding layer comprises a first dopant holding layer disposed on a top or an interior of the compound semiconductor layer, and a dopant content of the dopant holding layer is higher than a dopant content outside of the dopant holding layer;
   a source/drain pair disposed over the substrate and on both sides of the compound semiconductor layer; and
   a gate disposed on the compound semiconductor layer.

2. The semiconductor device as claimed in claim 1, wherein the dopant holding layer comprises aluminum nitride, aluminum gallium nitride, indium gallium nitride, or a combination thereof.

3. The semiconductor device as claimed in claim 1, wherein a thickness of the dopant holding layer ranges from 0.5 nm to 5 nm.

4. The semiconductor device as claimed in claim 1, wherein the dopant holding layer further comprises:
   a second dopant holding layer covering a sidewall of the compound semiconductor layer and extending between the source/drain pair and the barrier layer.

5. The semiconductor device as claimed in claim 4, further comprising the source/drain pair passing through the barrier layer and extending into the channel layer, and the second dopant holding layer extending between the source/drain pair and the channel layer.

6. The semiconductor device as claimed in claim 4, wherein the second dopant holding layer has an opening disposed on the compound semiconductor layer, and the gate is disposed at the opening.

7. The semiconductor device as claimed in claim 1, further comprising a two-dimensional electron gas (2DEG) recovery layer covering a sidewall of the compound semiconductor layer, wherein the two-dimensional electron gas recovery layer extends between the source/drain pair and the barrier layer.

8. The semiconductor device as claimed in claim 7, further comprising the source/drain pair passing through the barrier layer and extending into the channel layer, and the two-dimensional electron gas recovery layer extending between the source/drain pair and the channel layer.

9. The semiconductor device as claimed in claim 7, wherein the two-dimensional electron gas recovery layer comprises a hexagonal crystal binary compound semiconductor, graphene, or a combination thereof.

10. A method for forming semiconductor devices, comprising:
    forming a channel layer over a substrate;
    forming a barrier layer over the channel layer;
    forming a compound semiconductor layer and a dopant holding layer over the barrier layer, wherein a dopant content of the dopant holding layer is higher than a dopant content outside of the dopant holding layer;
    forming a source/drain pair over the substrate and on both sides of the compound semiconductor layer; and
    forming a gate over the compound semiconductor layer, wherein the dopant holding layer comprises a first dopant holding layer, and the first dopant holding layer is formed at a top or an interior of the compound semiconductor layer.

11. The method as claimed in claim 10, wherein forming the dopant holding layer comprises using metal organic chemical vapor deposition (MOCVD), atomic layer deposition (ALD), molecular beam epitaxy (MBE), liquid phase epitaxy (LPE), or a combination thereof.

12. The method as claimed in claim 10, wherein the dopant holding layer comprises aluminum nitride, aluminum gallium nitride, indium gallium nitride, or a combination thereof.

13. The method as claimed in claim 10, wherein a thickness of the dopant holding layer ranges from 0.5 nm to 5 nm.

14. The method as claimed in claim 10, wherein forming the dopant holding layer further comprises:
    forming a second dopant holding layer on a sidewall of the compound semiconductor layer, wherein the second dopant holding layer extends between the source/drain pair and the barrier layer.

15. The method as claimed in claim 14, wherein the source/drain pair extends further into the channel layer, and the second dopant holding layer extends between the source/drain pair and the channel layer.

16. The method as claimed in claim 14, wherein the second dopant holding layer has an opening formed over the compound semiconductor layer, and the gate is disposed at the opening.

17. The method as claimed in claim 10, further comprising forming a two-dimensional electron gas (2DEG) recovery layer on a sidewall of the compound semiconductor layer, wherein the two-dimensional electron gas recovery layer extends between the source/drain pair and the barrier layer.

18. The method as claimed in claim 17, wherein the source/drain pair pass through the barrier layer and extend into the channel layer, and the two-dimensional electron gas recovery layer extends between the source/drain pair and the channel layer.

19. The method as claimed in claim 17, wherein the two-dimensional electron gas recovery layer comprises a hexagonal crystal binary compound semiconductor, graphene, or a combination thereof.

\* \* \* \* \*